United States Patent
Yamashiro (10) Patent No.: US 11,863,129 B2
(45) Date of Patent: Jan. 2, 2024

(54) BIAS CIRCUIT

(71) Applicant: Murata Manufacturing Co., Ltd., Kyoto (JP)

(72) Inventor: Hideyo Yamashiro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 319 days.

(21) Appl. No.: 17/328,473

(22) Filed: May 24, 2021

(65) Prior Publication Data

US 2021/0367561 A1 Nov. 25, 2021

(30) Foreign Application Priority Data

May 25, 2020 (JP) .................................. 2020-090842

(51) Int. Cl.
*H03F 1/30* (2006.01)
*H03F 3/21* (2006.01)

(52) U.S. Cl.
CPC ................. *H03F 1/30* (2013.01); *H03F 3/21* (2013.01); *H03F 2200/447* (2013.01)

(58) Field of Classification Search
CPC ........ H03F 1/30; H03F 3/21; H03F 2200/447; G05F 1/567
USPC ................................................... 330/296, 300
See application file for complete search history.

(56) References Cited

U.S. PATENT DOCUMENTS 8,791,761 B2 * 7/2014 Ding ..................... H03F 3/3066
330/296

FOREIGN PATENT DOCUMENTS

| JP | H08-139587 A | 5/1996 |
|----|--------------|--------|
| JP | 4676177 B2 | 4/2011 |

* cited by examiner

*Primary Examiner* — Andrea Lindgren Baltzell
*Assistant Examiner* — Khiem D Nguyen
(74) *Attorney, Agent, or Firm* — Pearne & Gordon LLP (57) ABSTRACT

A bias circuit includes first to sixth transistors and first to fifth resistors. The collector of the fifth transistor is coupled to a node in a path connecting the collector of the fourth transistor and one end of the third resistor. The collector of the sixth transistor Tr6 is coupled to one end of the fifth resistor.

15 Claims, 6 Drawing Sheets

BIAS CIRCUIT

CROSS REFERENCE TO RELATED APPLICATION

This application claims priority from Japanese Patent Application No. 2020-090842 filed on May 25, 2020. The content of this application is incorporated herein by reference in its entirety.

BACKGROUND

The present disclosure relates to a bias circuit for supplying a bias voltage.

A circuit for generating a predetermined bias voltage by using a band gap has been disclosed (for example, Japanese Unexamined Patent Application Publication No. 8-139587 (Patent Document 1)). Such a circuit is referred to as a Widlar bandgap reference circuit. This circuit can produce a fixed bias voltage regardless of temperature variations by using a negative temperature coefficient depending on the transistor structure and a resistor's positive temperature coefficient cancelling each other out.

BRIEF SUMMARY

The circuit disclosed in Patent Document 1 needs a current source using a P-ch transistor or depletion-mode field-effect transistor (FET), which causes cost problems. It can be considered that a resistor is used instead of the current source. Using a resistor, however, causes a problem in which the bias voltage varies along with supply voltage.

The present disclosure provides a bias circuit capable of supplying stable bias voltage regardless of supply voltage.

A bias circuit according to an aspect of the present disclosure includes a first transistor including a first terminal functioning as a base or gate, a second terminal functioning as a collector or drain, and a third terminal functioning as an emitter or source, a second transistor including a fourth terminal functioning as a base or gate, a fifth terminal functioning as a collector or drain, and a sixth terminal functioning as an emitter or source, a third transistor including a seventh terminal functioning as a base or gate, an eighth terminal functioning as a collector or drain, and a ninth terminal functioning as an emitter or source, a fourth transistor including a tenth terminal functioning as a base or gate, an eleventh terminal functioning as a collector or drain, and a twelfth terminal functioning as an emitter or source, a fifth transistor including a thirteenth terminal functioning as a base or gate, a fourteenth terminal functioning as a collector or drain, and a fifteenth terminal functioning as an emitter or source, a sixth transistor including a sixteenth terminal functioning as a base or gate, a seventeenth terminal functioning as a collector or drain, and an eighteenth terminal functioning as an emitter or source, a first resistor, a second resistor, a third resistor, a fourth resistor, and a fifth resistor. The second terminal, one end of the first resistor, and one end of the fifth resistor are coupled to each other and further coupled to a power supply terminal. The first terminal, the fifth terminal, and the other end of the first resistor are coupled to each other. The third terminal, one end of the second resistor, and one end of the third resistor are coupled to each other and further coupled to an output terminal. The fourth terminal, the eighth terminal, and the other end of the second resistor are coupled to each other. The seventh terminal, the tenth terminal, the eleventh terminal, the fourteenth terminal, and the other end of the third resistor are coupled to each other. The thirteenth terminal, the sixteenth terminal, the seventeenth terminal, and the other end of the fifth resistor are coupled to each other. The ninth terminal and one end of the fourth resistor are coupled to each other. The sixth terminal, the twelfth terminal, the fifteenth terminal, the eighteenth terminal, and the other end of the fourth resistor are coupled to each other and further coupled to the ground.

A bias circuit according to another aspect of the present disclosure includes a first transistor including a first terminal functioning as a base or gate, a second terminal functioning as a collector or drain, and a third terminal functioning as an emitter or source, a second transistor including a fourth terminal functioning as a base or gate, a fifth terminal functioning as a collector or drain, and a sixth terminal functioning as an emitter or source, a third transistor including a seventh terminal functioning as a base or gate, an eighth terminal functioning as a collector or drain, and a ninth terminal functioning as an emitter or source, a fourth transistor including a tenth terminal functioning as a base or gate, an eleventh terminal functioning as a collector or drain, and a twelfth terminal functioning as an emitter or source, a fifth transistor including a thirteenth terminal functioning as a base or gate, a fourteenth terminal functioning as a collector or drain, and a fifteenth terminal functioning as an emitter or source, a sixth transistor including a sixteenth terminal functioning as a base or gate, a seventeenth terminal functioning as a collector or drain, and an eighteenth terminal functioning as an emitter or source, a first resistor, a second resistor, a third resistor, a fourth resistor, and a fifth resistor. The second terminal, one end of the first resistor, and one end of the fifth resistor are coupled to each other and further coupled to a power supply terminal. The first terminal, the fifth terminal, and the other end of the first resistor are coupled to each other and further coupled to an output terminal. The third terminal, one end of the second resistor, and one end of the third resistor are coupled to each other. The fourth terminal, the eighth terminal, and the other end of the second resistor are coupled to each other. The seventh terminal, the tenth terminal, the eleventh terminal, the fourteenth terminal, and the other end of the third resistor are coupled to each other. The thirteenth terminal, the sixteenth terminal, the seventeenth terminal, and the other end of the fifth resistor are coupled to each other. The ninth terminal and one end of the fourth resistor are coupled to each other. The sixth terminal, the twelfth terminal, the fifteenth terminal, the eighteenth terminal, and the other end of the fourth resistor are coupled to each other and further coupled to the ground.

The present disclosure can provide the bias circuit capable of supplying stable bias voltage regardless of supply voltage.

Other features, elements, characteristics and advantages of the present disclosure will become more apparent from the following detailed description of embodiments of the present disclosure with reference to the attached drawings.

DETAILED DESCRIPTION

Hereinafter, embodiments of the present disclosure will be described in detail with reference to the drawings. It should be noted that the embodiment described below is a comprehensive or specific instance. Specifics including numerical values, shapes, materials, constituent elements, arrangements of the constituent elements, and modes of connection given in the following embodiment are mere instances and are not intended to limit the present disclosure. Among the constituent elements in the following embodiment, constituent elements not recited in any of the independent claims are described as arbitrary constituent elements. Furthermore, the size or the size ratio of the constituent elements illustrated in the drawings is not necessarily presented in an exact manner. Like reference characters are used to denote substantially like configurations in the drawings, and redundant descriptions thereof may be omitted or simplified. Configurations less related to features of the present disclosure may be not assigned any reference character in the drawings including circuit diagrams or not described.

Embodiment

Firstly, a bias circuit according to a comparative example will be explained before a description of a bias circuit according to an embodiment.

Figure 1:
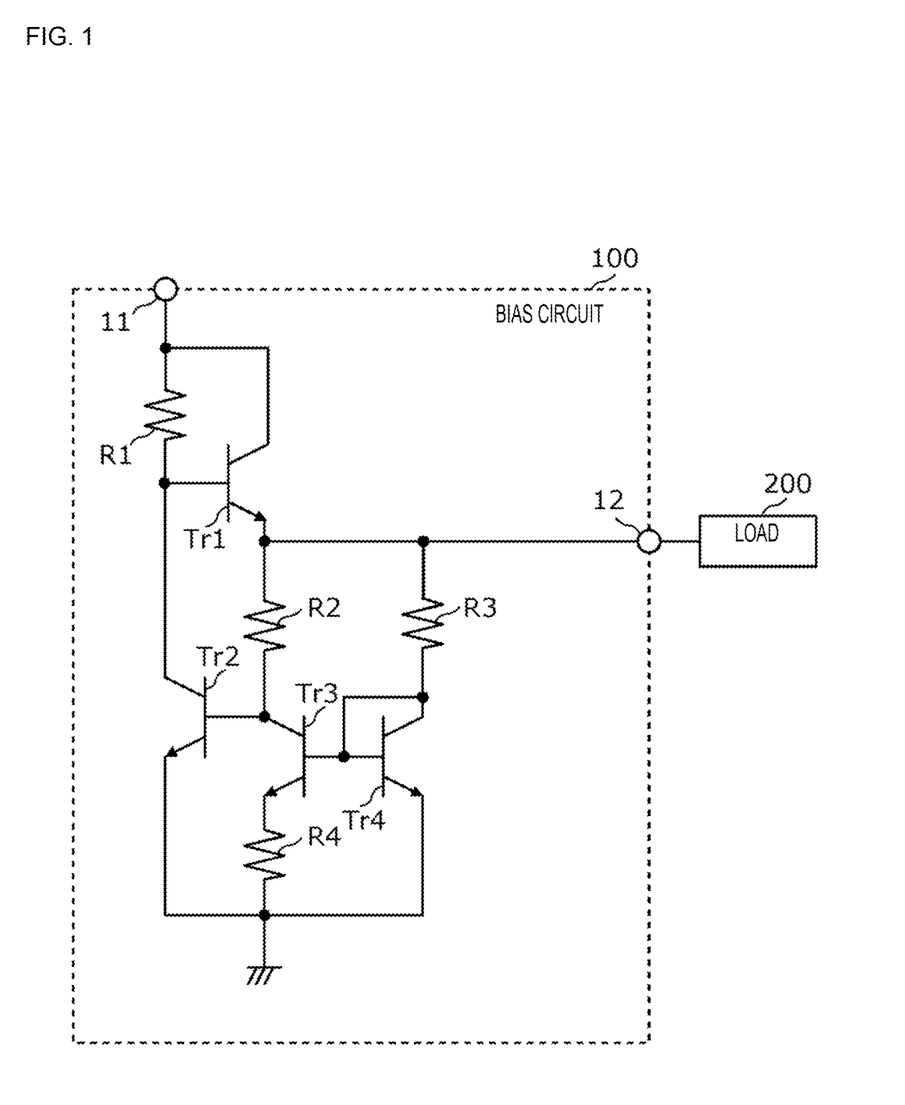
FIG. 1 is a circuit configuration diagram illustrating an example of a bias circuit according to a comparative example.

FIG. 1 is a circuit configuration diagram illustrating an example of a bias circuit 100 according to the comparative example. The bias circuit according to the embodiment partially includes the circuit configuration of the bias circuit 100 according to the comparative example, and constituent elements included in the bias circuit 100 are not described in detail here.

The bias circuit 100 according to the comparative example uses a resistor R1 instead of a current source using a P-ch transistor or depletion-mode field-effect transistor (FET) for the purpose of reducing costs of the bias circuit 100. The resistor R1 can be used instead of a current source because a current according to the supply voltage supplied from a terminal 11 flows through the resistor R1. However, for example, when a battery in a device, such as a portable terminal supplies the supply voltage, as the battery capacity decreases with the use of the device, the supply voltage also gradually decreases, which results in decrease in the current flowing through the resistor R1. As a result, the bias voltage outputted from a terminal 12 varies along with the supply voltage. Specifically, variations in the supply voltage vary the current flowing through a resistor R2 and the current flowing through a resistor R3, and consequently, the bias voltage outputted from the terminal 12 varies.

In consideration of such a problem, the present disclosure provides a bias circuit capable of supplying stable bias voltage regardless of supply voltage. The following will be a description of such a bias circuit.

Figure 2:
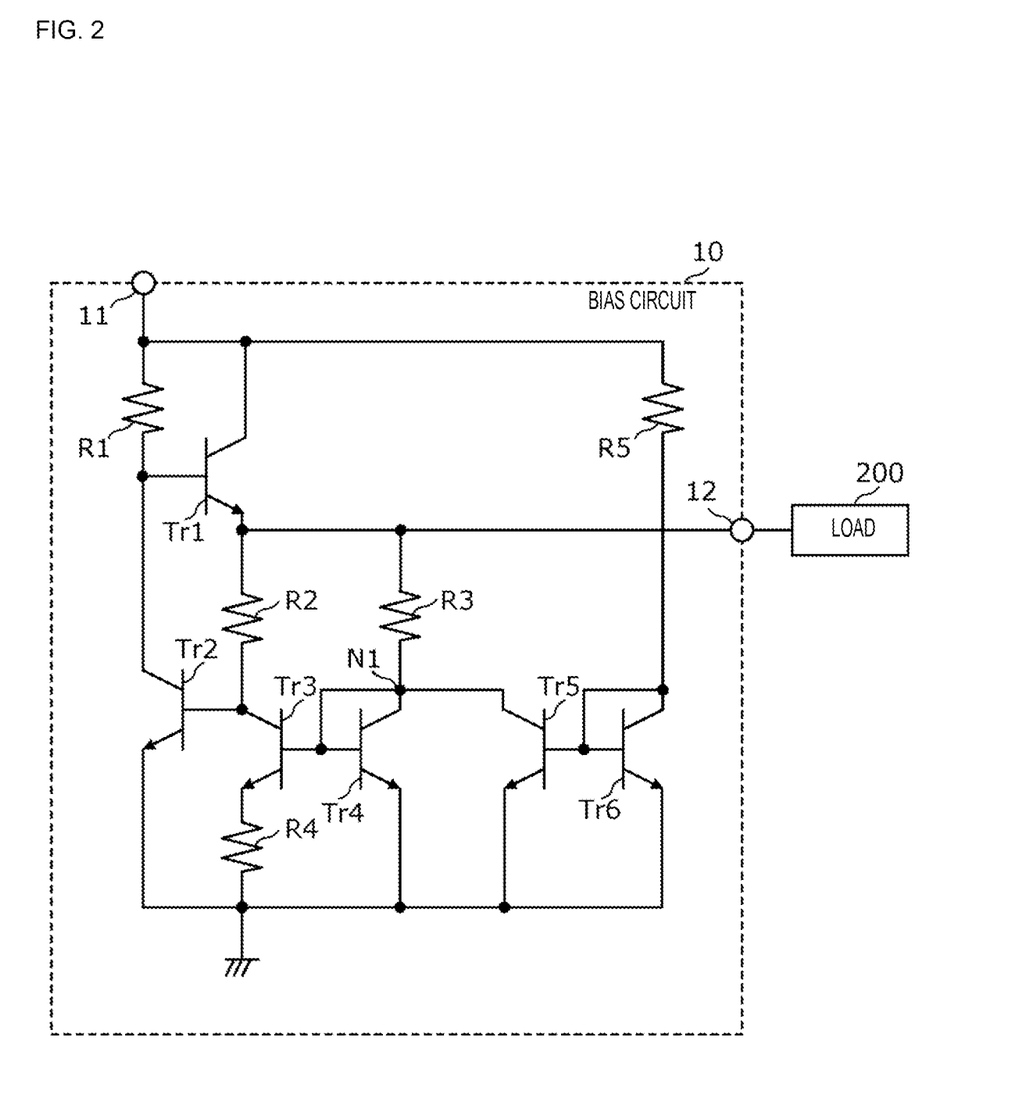
FIG. 2 is a circuit configuration diagram illustrating an example of a bias circuit according to an embodiment.

FIG. 2 is a circuit configuration diagram illustrating an example of a bias circuit 10 according to the embodiment. FIG. 2 also illustrates a load 200.

The bias circuit 10 is configured to produce a bias voltage and supply the produced bias voltage to the load 200. For example, the bias circuit 10 has the terminals 11 and 12. The terminal 11 is an example of a power supply terminal coupled to a power supply. The power supply supplies a supply voltage to the bias circuit 10 via the terminal 11. The terminal 12 is an example of an output terminal coupled to the load 200. The bias circuit 10 supplies a bias voltage to the load 200 via the terminal 12.

The bias circuit 10 includes transistors Tr1, Tr2, Tr3, Tr4, Tr5, and Tr6 and resistors R1, R2, R3, R4, and R5.

The transistor Tr1 is an example of a first transistor including a first terminal functioning as a base or gate, a second terminal functioning as a collector or drain, and a third terminal functioning as an emitter or source.

The transistor Tr2 is an example of a second transistor including a fourth terminal functioning as a base or gate, a fifth terminal functioning as a collector or drain, and a sixth terminal functioning as an emitter or source.

The transistor Tr3 is an example of a third transistor including a seventh terminal functioning as a base or gate, an eighth terminal functioning as a collector or drain, and a ninth terminal functioning as an emitter or source.

The transistor Tr4 is an example of a fourth transistor including a tenth terminal functioning as a base or gate, an eleventh terminal functioning as a collector or drain, and a twelfth terminal functioning as an emitter or source.

The transistor Tr5 is an example of a fifth transistor including a thirteenth terminal functioning as a base or gate, a fourteenth terminal functioning as a collector or drain, and a fifteenth terminal functioning as an emitter or source.

The transistor Tr6 is an example of a sixth transistor including a sixteenth terminal functioning as a base or gate, a seventeenth terminal functioning as a collector or drain, and an eighteenth terminal functioning as an emitter or source.

The resistor R1 is an example of a first resistor. The resistor R2 is an example of a second resistor. The resistor R3 is an example of a third resistor. The resistor R4 is an example of a fourth resistor. The resistor R5 is an example of a fifth resistor. The following description includes expressions, such as one end of a resistor and the other end of the resistor. For example, one end denotes a terminal on the upper side of a corresponding resistor in the drawings, and the other end denotes a terminal on the lower side of a corresponding resistor in the drawings.

The transistors Tr5 and Tr6 together form a current mirror circuit having a function of equalizing the amount of current flowing from a node N1 (refer to FIG. 2) into the fourteenth terminal of the transistor Tr5 and the amount of current flowing into the resistor R5.

For example, the transistors Tr1, Tr2, Tr3, Tr4, Tr5, and Tr6 are bipolar transistors, such as heterojunction bipolar transistors. In this case, the first terminal, the fourth terminal, the seventh terminal, the tenth terminal, the thirteenth terminal, and the sixteenth terminal are bases; the second terminal, the fifth terminal, the eighth terminal, the eleventh terminal, the fourteenth terminal, and the seventeenth terminal are collectors; the third terminal, the sixth terminal, the ninth terminal, the twelfth terminal, the fifteenth terminal, and the eighteenth terminal are emitters.

The collector of the transistor Tr1, one end of the resistor R1, and one end of the resistor R5 are coupled to each other and further coupled to the terminal 11. The base of the transistor Tr1, the collector of the transistor Tr2, and the other end of the resistor R1 are coupled to each other. The emitter of the transistor Tr1, one end of the resistor R2, and the one end of the resistor R3 are coupled to each other and further coupled to the terminal 12. The base of the transistor Tr2, the collector of the transistor Tr3, and the other end of the resistor R2 are coupled to each other. The base of the transistor Tr3, the base of the transistor Tr4, the collector of the transistor Tr4, the collector of the transistor Tr5, and the other end of the resistor R3 are coupled to each other. The node N1 is a node in a path connecting the collector of the transistor Tr4 and the other end of the resistor R3. The base of the transistor Tr5, the base of the transistor Tr6, the collector of the transistor Tr6, and the other end of the resistor R5 are coupled to each other. The emitter of the transistor Tr3 and the one end of the resistor R4 are coupled to each other. The emitter of the transistor Tr2, the emitter of the transistor Tr4, the emitter of the transistor Tr5, the emitter of the transistor Tr6, and the other end of the resistor R4 are coupled to each other and further coupled to the ground.

The transistors Tr2, Tr3, and Tr4 and the resistors R2, R3, and R4 together form a Widlar bandgap reference circuit.

When $V_{bgr}$ is a bias voltage outputted from the terminal 12, $V_{BE2}$ is a voltage between the base and emitter of the transistor Tr2, and $V_{R2}$ is a voltage applied to the resistor R2 (that is, a voltage between the emitter of the transistor Tr1 and the base of the transistor Tr2), $V_{bgr}$ is given by Equation 1.

$$V_{bgr} = V_{BE2} + V_{R2} \quad \text{(Equation 1)}$$

When T is an absolute temperature of the transistor Tr2, for example, Equation 2 is satisfied.

$$\frac{\partial V_{BE2}}{\partial T} = -1.8 (\text{mV}/^\circ \text{C.}) \quad \text{(Equation 2)}$$

According to this equation, the temperature coefficient of the voltage between the base and emitter of the transistor Tr2 is −1.8 mV/° C. The temperature coefficient −1.8 mV/° C. is a mere example. The temperature coefficient of the voltage between the base and emitter of the transistor Tr2 is dependent on the transistor structure of the transistor Tr2.

When R2 is a resistance of the resistor R2, R3 is a resistance of the resistor R3, R4 is a resistance of the resistor R4, k is the Boltzmann constant, q is the electric charge carried by an electron, Equation 3 is satisfied.

$$\frac{\partial V_{R2}}{\partial T} = \frac{R2}{R4} \cdot \frac{k}{q} \cdot \ln \frac{R2}{R3} \quad \text{(Equation 3)}$$

According to Equation 3, controlling the ratio of the resistance of the resistor R2 to the resistance of the resistor R3 and the ratio of the resistance of the resistor R2 to the resistance of the resistor R4 can control the temperature coefficient of the voltage applied to the resistor R2. For example, by setting the temperature coefficient of the voltage applied to the resistor R2 to 1.8 mV/° C., the negative temperature coefficient (−1.8 mV/° C.) of the voltage between the base and emitter of the transistor Tr2 is canceled, and as a result, a fixed bias voltage can be outputted from the terminal 12 regardless of variations in temperature.

Although the bias circuit 10 uses the resistor R1 instead of a current source, a stable bias voltage can be supplied regardless of supply voltage because the bias circuit 10 includes the transistors Tr5 and Tr6 and the resistor R5. The following describes how stable bias voltage can be supplied regardless of supply voltage.

When the supply voltage from a power supply coupled to the terminal 11 varies, the current flowing in the resistor R5 varies along with the variations. When the supply voltage from the power supply coupled to the terminal 11 varies, the current flowing into the resistor R3 also varies. Because the transistors Tr5 and Tr6 (that is, a current mirror circuit) has a function of equalizing the current flowing from the node N1 into the collector of the transistor Tr5 and the current flowing into the resistor R5, when the current flowing into the resistor R5 varies, the current flowing from the node N1 into the collector of the transistor Tr5 also varies in the same manner. The amount of variation in the current flowing into the resistor R3 flows from the node N1 into the collector of the transistor Tr5, whereas the current flowing from the node N1 into the collector of the transistor Tr4 is maintained at a fixed amount regardless of the variations in the supply voltage. Because the transistors Tr3 and Tr4 form a current mirror circuit, a fixed current flows through the resistor R2, the transistor Tr3, and the resistor R4, and as a result, the bias voltage is maintained at a fixed level regardless of variations in the supply voltage.

Figure 3:
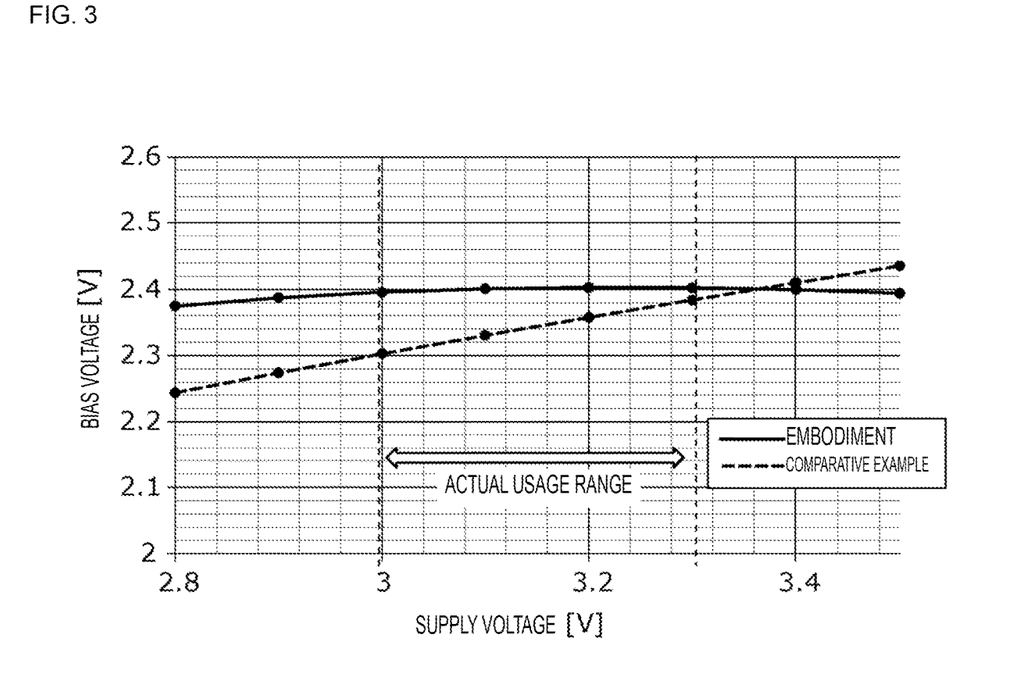
FIG. 3 is a graph illustrating the relationship between supply voltage and bias voltage with respect to the bias circuit according to the embodiment and the bias circuit according to the comparative example.

FIG. 3 is a graph illustrating the relationship between supply voltage and bias voltage with respect to the bias circuit 10 according to the embodiment and the bias circuit 100 according to the comparative example.

As for the bias circuit 100 according to the comparative example, it can be seen that the bias voltage varies with variations in the supply voltage. By contrast, as for the bias circuit 10 according to the embodiment, the bias voltage is maintained at a substantially fixed level regardless of variations in the supply voltage. For example, it can be seen that, in the range of 3 to 3.3 V, which is a range of supply voltage actually used in devices, such as portable terminals, the bias voltage is maintained at approximately 2.4 V.

Next, a specific example of the load 200 will be described.

Figure 4:
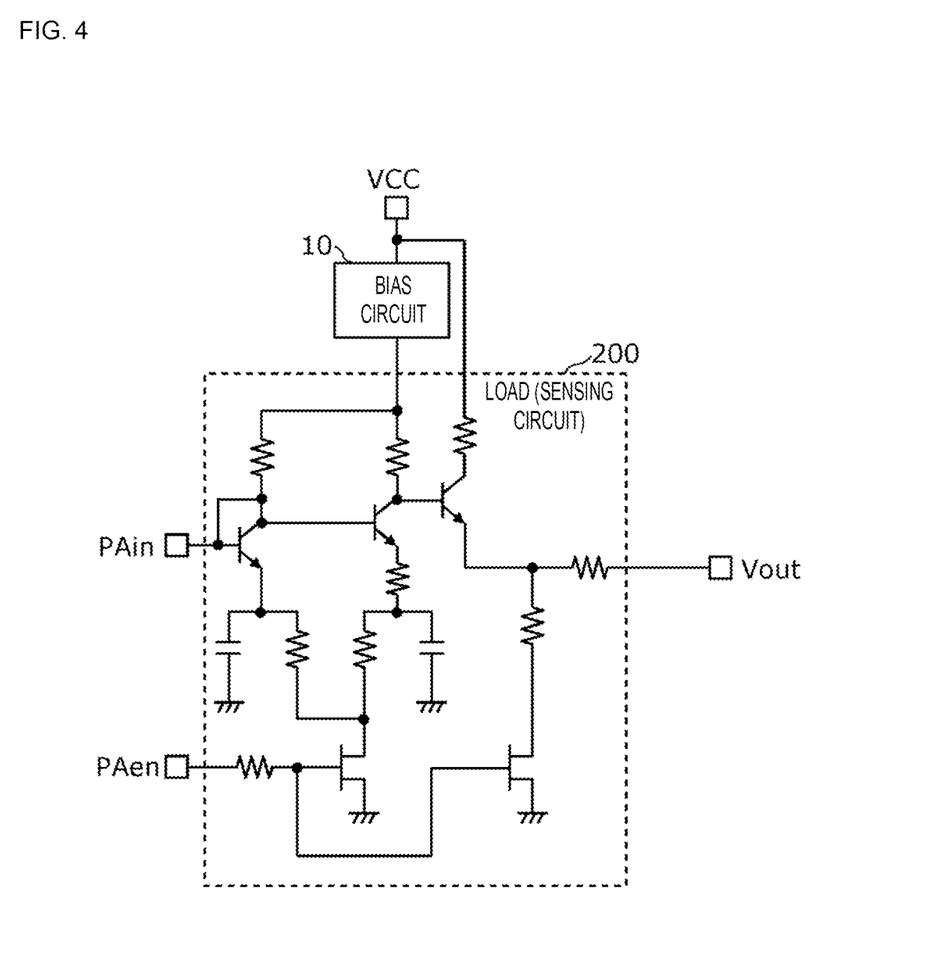
FIG. 4 is a circuit configuration diagram illustrating an example of a load to which the bias circuit according to the embodiment supplies bias voltage.

FIG. 4 is a circuit configuration diagram illustrating an example of the load 200 to which the bias circuit 10 according to the embodiment supplies bias voltage. FIG. 4 also illustrates the bias circuit 10 that supplies bias voltage to the load 200.

The terminal 11 is provided on the upper side of the bias circuit 10 in FIG. 4, and a power supply (indicated by "VCC" in FIG. 4) is coupled to the terminal 11; the terminal 12 is provided on the lower side of the bias circuit 10 in FIG. 4, and the load 200 (sensing circuit) is coupled to the terminal 12. The terminals 11 and 12 are not illustrated in FIG. 4.

Although detailed descriptions of constituent elements included in the load 200 illustrated in FIG. 4 are omitted, the load 200 has a function of sensing output power of a power amplifier. An output signal from a power amplifier is partially inputted to "PAin" indicated in FIG. 4. The load 200 outputs from "Vout" a voltage according to the signal inputted to "PAin". This means that the voltage outputted from "Vout" corresponds to output power of the power amplifier, and thus, the output power can be measured by measuring the voltage outputted from "Vout". An enable signal is inputted to "PAen". While the enable signal is inputted to "PAen", the function of sensing output power of a power amplifier is active in the load 200.

The transistors in the load 200 are, for example, bipolar transistors (for example, gallium arsenide-based bipolar transistors), which contributes to implementation of the load 200 with reduced size and high performance. The transistors Tr2, Tr3, Tr4, Tr5, and Tr6 in the bias circuit 10 may be bipolar transistors (for example, gallium arsenide-based bipolar transistors), which contributes to implementation of the bias circuit 10 with reduced size and high performance.

The transistors Tr1, Tr2, Tr3, Tr4, Tr5, and Tr6 may be FETs. In this case, the first terminal, the fourth terminal, the seventh terminal, the tenth terminal, the thirteenth terminal, and the sixteenth terminal are gates; the second terminal, the fifth terminal, the eighth terminal, the eleventh terminal, the fourteenth terminal, and the seventeenth terminal are drains; the third terminal, the sixth terminal, the ninth terminal, the twelfth terminal, the fifteenth terminal, and the eighteenth terminal are sources. In the above description, base may be replaced with gate, collector may be replaced with drain, and emitter may be replaced with source.

As described above, the bias circuit 10 includes the transistor Tr1 including the first terminal functioning as a base or gate, the second terminal functioning as a collector or drain, and the third terminal functioning as an emitter or source, the transistor Tr2 including the fourth terminal functioning as a base or gate, the fifth terminal functioning as a collector or drain, and the sixth terminal functioning as an emitter or source, the transistor Tr3 including the seventh terminal functioning as a base or gate, the eighth terminal functioning as a collector or drain, and the ninth terminal functioning as an emitter or source, the transistor Tr4 including the tenth terminal functioning as a base or gate, the eleventh terminal functioning as a collector or drain, and the twelfth terminal functioning as an emitter or source, the transistor Tr5 including the thirteenth terminal functioning as a base or gate, the fourteenth terminal functioning as a collector or drain, and the fifteenth terminal functioning as an emitter or source, the transistor Tr6 including the sixteenth terminal functioning as a base or gate, the seventeenth terminal functioning as a collector or drain, and the eighteenth terminal functioning as an emitter or source, the resistor R1, the resistor R2, the resistor R3, the resistor R4, and the resistor R5. The second terminal, the one end of the resistor R1, and the one end of the resistor R5 are coupled to each other and further coupled to the terminal 11. The first terminal, the fifth terminal, and the other end of the resistor R1 are coupled to each other. The third terminal, the one end of the resistor R2, and the one end of the resistor R3 are coupled to each other and further coupled to the terminal 12. The fourth terminal, the eighth terminal, and the other end of the resistor R2 are coupled to each other. The seventh terminal, the tenth terminal, the eleventh terminal, the fourteenth terminal, and the other end of the resistor R3 are coupled to each other. The thirteenth terminal, the sixteenth terminal, the seventeenth terminal, and the other end of the resistor R5 are coupled to each other. The ninth terminal and the one end of the resistor R4 are coupled to each other. The sixth terminal, the twelfth terminal, the fifteenth terminal, the eighteenth terminal, and the other end of the resistor R4 are coupled to each other and further coupled to the ground.

With this configuration, a current according to variations in supply voltage flows into the resistor R5; the current mirror circuit constituted by the transistors Tr5 and Tr6 passes the current according to the variations from the node N1 into the fourteenth terminal of the transistor Tr5; as a result, the current flowing from the node N1 into the eleventh terminal of the transistor Tr4 is maintained at a fixed amount regardless of the variations in the supply voltage. Because the transistors Tr3 and Tr4 form a current mirror circuit, a fixed current flows through the resistor R2, the transistor Tr3, and the resistor R4, and as a result, the bias voltage is maintained at a fixed level regardless of variations in the supply voltage. As such, the behavior of bias voltage dependent on supply voltage is eliminated, and thus, a stable bias voltage can be supplied regardless of supply voltage. Additionally, because the bias circuit 10 uses the resistor R1 instead of a current source, cost reduction can be achieved.

For example, the transistors Tr2, Tr3, and Tr4 may be bipolar transistors.

This can contribute to implementation of the bias circuit 10 with reduced size and high performance. For example, when the load 200 coupled to the terminal 12 is a small load, the bias circuit 10 also needs to be miniaturized to downsize the entire system. In this case, because the transistors in the bias circuit 10 are bipolar transistors, the entire system can be downsized.

For example, a sensing circuit for sensing output power of a power amplifier may be coupled to the terminal 12.

In this case, regardless of supply voltage, a stable bias voltage can be supplied to the sensing circuit for sensing output power of a power amplifier.

First Modification

Next, a bias circuit according to a first modification will be described.

Figure 5:
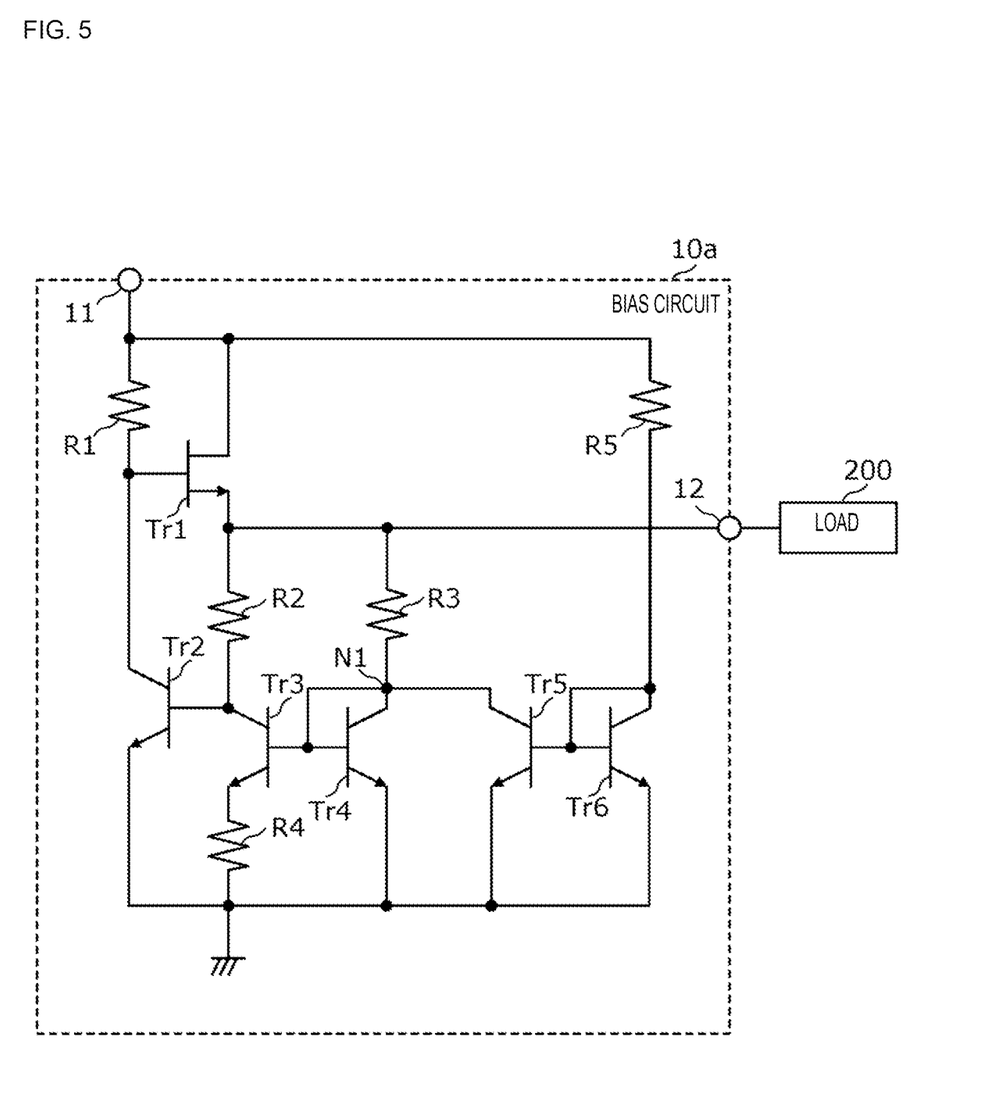
FIG. 5 is a circuit configuration diagram illustrating an example of a bias circuit according to a first modification.

FIG. 5 is a circuit configuration diagram illustrating an example of a bias circuit 10a according to the first modification.

The bias circuit 10a according to the first modification differs from the bias circuit 10 according to the embodiment in that the transistor Tr1 is a FET (specifically, an enhancement-mode FET). Other points of the bias circuit 10a according to the first modification are identical to those of the bias circuit 10 according to the embodiment, and descriptions thereof are not repeated.

Because the transistor Tr1 is a FET, the bias circuit 10a can supply more stable bias voltage than if the transistor Tr1 is a bipolar transistor. This is because voltage drop between the gate and source of a FET is less likely to be dependent on temperature than a bipolar transistor. Moreover, the amount of voltage drop between the gate and source of the transistor Tr1 is less than that of a bipolar transistor, and thus, a low-power supply voltage can be used as a power supply. Alternatively, bias voltage may be set at a level close to supply voltage.

Second Modification

Next, a bias circuit according to a second modification will be described.

Figure 6:
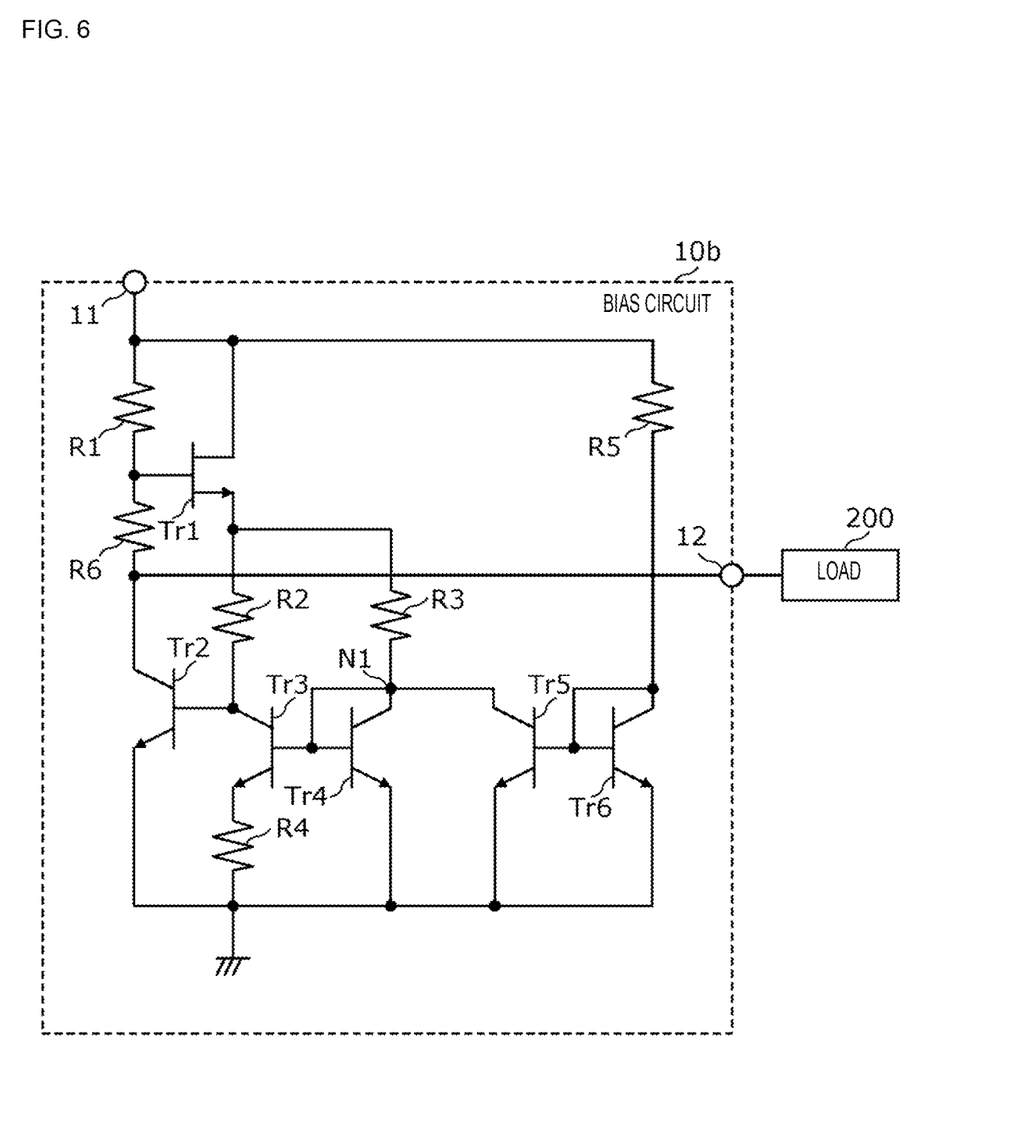
FIG. 6 is a circuit configuration diagram illustrating an example of a bias circuit according to a second modification.

FIG. 6 is a circuit configuration diagram illustrating an example of a bias circuit 10b according to the second modification.

The bias circuit 10b according to the second modification differs from the bias circuit 10a according to the first modification in the following points: a resistor R6 is further included; the first terminal of the transistor Tr1, the fifth terminal of the transistor Tr2, and the other end of the resistor R1 are coupled to each other and further coupled to the terminal 12 (specifically, the first terminal of the transistor Tr1 and the other end of the resistor R1 are coupled to the terminal 12 via the resistor R6); the third terminal of the transistor Tr1, the one end of the resistor R2, and the one end of the resistor R3 are coupled to each other. Other points of the bias circuit 10b according to the second modification are identical to those of the bias circuit 10a according to the first modification, and descriptions thereof are not repeated. It is assumed that a fixed load current flows through the load 200.

The description of the bias circuit 10a according to the first modification has used an example in which the terminal 12 is coupled to the third terminal of the transistor Tr1, whereas in the second modification the terminal 12 is coupled to the first terminal of the transistor Tr1 (specifically, the terminal 12 is coupled to the first terminal of the transistor Tr1 via the resistor R6).

When the terminal 12 is coupled to the third terminal of the transistor Tr1, the bias voltage outputted from the terminal 12 is lowered by the amount of voltage drop across the resistor R1 and the amount of voltage drop between the gate and source of the transistor Tr1 in comparison to supply voltage. Thus, a power supply with a supply voltage higher than these voltage drops needs to be prepared.

By contrast, when the terminal 12 is coupled to the first terminal of the transistor Tr1, the bias voltage outputted from the terminal 12 is not lowered by the amount of voltage drop between the gate and source of the transistor Tr1. Thus, a power supply with a supply voltage at least higher than voltage drop across the resistor R1 needs to be prepared.

The resistor R6 is an example of a sixth resistor for controlling the level of bias voltage. The bias voltage outputted from the terminal 12 is lowered by the amount of voltage drop across the resistor R6 in comparison to supply voltage. For example, the resistance of the resistor R6 is set at a small value that enables the voltage drop caused by current flowing through the resistor R6 to be smaller than the voltage drop between the gate and source of the transistor Tr1.

As described above, the bias circuit 10b includes the transistor Tr1 including the first terminal functioning as a base or gate, the second terminal functioning as a collector or drain, and the third terminal functioning as an emitter or source, the transistor Tr2 including the fourth terminal functioning as a base or gate, the fifth terminal functioning as a collector or drain, and the sixth terminal functioning as an emitter or source, the transistor Tr3 including the seventh terminal functioning as a base or gate, the eighth terminal functioning as a collector or drain, and the ninth terminal functioning as an emitter or source, the transistor Tr4 including the tenth terminal functioning as a base or gate, the eleventh terminal functioning as a collector or drain, and the twelfth terminal functioning as an emitter or source, the transistor Tr5 including the thirteenth terminal functioning as a base or gate, the fourteenth terminal functioning as a collector or drain, and the fifteenth terminal functioning as an emitter or source, the transistor Tr6 including the sixteenth terminal functioning as a base or gate, the seventeenth terminal functioning as a collector or drain, and the eighteenth terminal functioning as an emitter or source, the resistor R1, the resistor R2, the resistor R3, the resistor R4, and the resistor R5. The second terminal, the one end of the resistor R1, and the one end of the resistor R5 are coupled to each other and further coupled to the terminal 11. The first terminal, the fifth terminal, and the other end of the resistor R1 are coupled to each other and further coupled to the terminal 12. The third terminal, the one end of the resistor R2, and the one end of the resistor R3 are coupled to each other. The fourth terminal, the eighth terminal, and the other end of the resistor R2 are coupled to each other. The seventh terminal, the tenth terminal, the eleventh terminal, the fourteenth terminal, and the other end of the resistor R3 are coupled to each other. The thirteenth terminal, the sixteenth terminal, the seventeenth terminal, and the other end of the resistor R5 are coupled to each other. The ninth terminal and the one end of the resistor R4 are coupled to each other. The sixth terminal, the twelfth terminal, the fifteenth terminal, the eighteenth terminal, and the other end of the resistor R4 are coupled to each other and further coupled to the ground.

This yields the bias circuit 10b capable of supplying stable bias voltage regardless of supply voltage. Furthermore, because the terminal 12 is coupled to the first terminal of the transistor Tr1, the bias voltage outputted from the terminal 12 is not lowered by the amount of voltage drop between the gate and source of the transistor Tr1. As a result, a power supply with low supply voltage can be used. Alternatively, bias voltage may be set at a level close to supply voltage.

For example, the bias circuit 10b may further include the resistor R6. Via the resistor R6, the first terminal and the other end of the resistor R1 may be coupled to the terminal 12.

With this configuration, controlling the resistance of the resistor R6 can control the level of bias voltage.

OTHER EMBODIMENTS

The bias circuit according to the present disclosure has been described by using the embodiment, but the present disclosure is not limited to the embodiment described above. The present disclosure also embraces other embodiments implemented as any combination of the constituent elements of the embodiment, other modified examples obtained by making various modifications to the embodiment that occur to those skilled in the art without necessarily departing from the scope of the present disclosure, and various hardware devices including the amplifier circuit according to the present disclosure.

For example, the second modification uses the example in which the transistor Tr1 is a FET, but the transistor Tr1 may be a bipolar transistor in the second modification similarly to the embodiment.

For example, the second modification uses the example in which the bias circuit 10b includes the resistor R6, but the bias circuit 10b does not necessarily include the resistor R6.

For example, the embodiment uses the example in which the load 200 is a sensing circuit for sensing output power of a power amplifier, but the load 200 is not necessarily such a sensing circuit.

The present disclosure can be used for a wide variety of communication devices, such as mobile phones, as a bias circuit for supplying bias voltage to, for example, a sensing circuit for sensing output power of a power amplifier. While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A bias circuit comprising:
a first transistor including a first terminal coupled to a base or a gate of the first transistor, a second terminal coupled to a collector or a drain of the first transistor, and a third terminal coupled to an emitter or a source of the first transistor;
a second transistor including a fourth terminal coupled to a base or a gate of the second transistor, a fifth terminal coupled to a collector or a drain of the second transistor, and a sixth terminal coupled to an emitter or a source of the second transistor;

a third transistor including a seventh terminal coupled to a base or a gate of the third transistor, an eighth terminal coupled to a collector or a drain of the third transistor, and a ninth terminal coupled to an emitter or a source of the third transistor;

a fourth transistor including a tenth terminal coupled to a base or a gate of the fourth transistor, an eleventh terminal coupled to a collector or a drain of the fourth transistor, and a twelfth terminal coupled to an emitter or a source of the fourth transistor;

a fifth transistor including a thirteenth terminal coupled to a base or a gate of the fifth transistor, a fourteenth terminal coupled to a collector or a drain of the fifth transistor, and a fifteenth terminal coupled to an emitter or a source of the fifth transistor;

a sixth transistor including a sixteenth terminal coupled to a base or a gate of the sixth transistor, a seventeenth terminal coupled to a collector or a drain of the sixth transistor, and an eighteenth terminal coupled to an emitter or a source of the sixth transistor;

a first resistor;
a second resistor;
a third resistor;
a fourth resistor; and
a fifth resistor, wherein:

the second terminal, a first end of the first resistor, and a first end of the fifth resistor are coupled to each other, and further coupled to a power supply terminal, the first terminal, the fifth terminal, and a second end of the first resistor are coupled to each other, the third terminal, a first end of the second resistor, and a first end of the third resistor are coupled to each other, and further coupled to an output terminal, the fourth terminal, the eighth terminal, and a second end of the second resistor are coupled to each other, the seventh terminal, the tenth terminal, the eleventh terminal, the fourteenth terminal, and a second end of the third resistor are coupled to each other, the thirteenth terminal, the sixteenth terminal, the seventeenth terminal, and a second end of the fifth resistor are coupled to each other, the ninth terminal and a first end of the fourth resistor are coupled to each other, and the sixth terminal, the twelfth terminal, the fifteenth terminal, the eighteenth terminal, and a second end of the fourth resistor are coupled to each other, and further coupled to ground.

2. A bias circuit comprising:

a first transistor including a first terminal coupled to a base or a gate of the first transistor, a second terminal coupled to a collector or a drain of the first transistor, and a third terminal coupled to an emitter or a source of the first transistor;

a second transistor including a fourth terminal coupled to a base or a gate of the second transistor, a fifth terminal coupled to a collector or a drain of the second transistor, and a sixth terminal coupled to an emitter or a source of the second transistor;

a third transistor including a seventh terminal coupled to a base or a gate of the third transistor, an eighth terminal coupled to a collector or a drain of the third transistor, and a ninth terminal coupled to an emitter or a source of the third transistor;

a fourth transistor including a tenth terminal coupled to a base or a gate of the fourth transistor, an eleventh terminal coupled to a collector or a drain of the fourth transistor, and a twelfth terminal coupled to an emitter or a source of the fourth transistor;

a fifth transistor including a thirteenth terminal coupled to a base or a gate of the fifth transistor, a fourteenth terminal coupled to a collector or a drain of the fifth transistor, and a fifteenth terminal coupled to an emitter or a source of the fifth transistor;

a sixth transistor including a sixteenth terminal coupled to a base or a gate of the sixth transistor, a seventeenth terminal coupled to a collector or a drain of the sixth transistor, and an eighteenth terminal coupled to an emitter or a source of the sixth transistor;

a first resistor;
a second resistor;
a third resistor;
a fourth resistor; and
a fifth resistor, wherein:

the second terminal, a first end of the first resistor, and a first end of the fifth resistor are coupled to each other, and further coupled to a power supply terminal, the first terminal, the fifth terminal, and a second end of the first resistor are coupled to each other, and further coupled to an output terminal, the third terminal, a first end of the second resistor, and a first end of the third resistor are coupled to each other, the fourth terminal, the eighth terminal, and a second end of the second resistor are coupled to each other, the seventh terminal, the tenth terminal, the eleventh terminal, the fourteenth terminal, and a second end of the third resistor are coupled to each other, the thirteenth terminal, the sixteenth terminal, the seventeenth terminal, and a second end of the fifth resistor are coupled to each other, the ninth terminal and a first end of the fourth resistor are coupled to each other, and the sixth terminal, the twelfth terminal, the fifteenth terminal, the eighteenth terminal, and a second end of the fourth resistor are coupled to each other, and further coupled to ground.

3. The bias circuit according to claim 2, further comprising:
a sixth resistor,
wherein the first terminal and the second end of the first resistor are coupled to the output terminal via the sixth resistor.

4. The bias circuit according to claim 1, wherein the first transistor is a field-effect transistor (FET).

5. The bias circuit according to claim 2, wherein the first transistor is a field-effect transistor (FET).

6. The bias circuit according to claim 3, wherein the first transistor is a field-effect transistor (FET).

7. The bias circuit according to claim 1, wherein the second transistor, the third transistor, and the fourth transistor are bipolar transistors.

8. The bias circuit according to claim 2, wherein the second transistor, the third transistor, and the fourth transistor are bipolar transistors.

9. The bias circuit according to claim 3, wherein the second transistor, the third transistor, and the fourth transistor are bipolar transistors.

10. The bias circuit according to claim 4, wherein the second transistor, the third transistor, and the fourth transistor are bipolar transistors.

11. The bias circuit according to claim 1, wherein a sensing circuit configured to sense an output power of a power amplifier is coupled to the output terminal.

12. The bias circuit according to claim 2, wherein a sensing circuit configured to sense an output power of a power amplifier is coupled to the output terminal.

13. The bias circuit according to claim 3, wherein a sensing circuit configured to sense an output power of a power amplifier is coupled to the output terminal.

14. The bias circuit according to claim 4, wherein a sensing circuit configured to sense an output power of a power amplifier is coupled to the output terminal.

15. The bias circuit according to claim 7, wherein a sensing circuit configured to sense an output power of a power amplifier is coupled to the output terminal.

* * * * *